United States Patent
Hsieh et al.

(10) Patent No.: US 12,426,272 B2
(45) Date of Patent: Sep. 23, 2025

(54) FERROELECTRIC TUNNEL JUNCTION MEMORY DEVICES WITH ENHANCED READ WINDOW

(71) Applicant: Taiwan Semiconductor Manufacturing Company, Ltd., Hsinchu (TW)

(72) Inventors: Wei Ting Hsieh, Hsinchu (TW); Kuen-Yi Chen, Hsinchu (TW); Yi-Hsuan Chen, Taoyuan (TW); Yu-Wei Ting, Taipei (TW); Yi Ching Ong, Hsinchu (TW); Kuo-Ching Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 500 days.

(21) Appl. No.: 17/840,003

(22) Filed: Jun. 14, 2022

(65) Prior Publication Data
US 2023/0403864 A1    Dec. 14, 2023

(51) Int. Cl.
*H10B 53/30* (2023.01)
*G11C 11/22* (2006.01)

(52) U.S. Cl.
CPC ............ *H10B 53/30* (2023.02); *G11C 11/221* (2013.01); *G11C 11/2275* (2013.01)

(58) Field of Classification Search
None
See application file for complete search history.

(56) References Cited

U.S. PATENT DOCUMENTS

| | | | | |
|---|---|---|---|---|
| 6,027,947 A | * | 2/2000 | Evans | H01L 28/55 257/E21.664 |
| 6,107,656 A | * | 8/2000 | Igarashi | H10B 51/00 257/295 |
| 6,509,601 B1 | * | 1/2003 | Lee | H10D 1/682 257/306 |
| 7,303,927 B2 | * | 12/2007 | Isobe | H10D 1/682 438/398 |
| 10,867,675 B2 | * | 12/2020 | Derner | H10D 1/68 |
| 2004/0266034 A1 | * | 12/2004 | Tatsunari | H01L 28/55 257/E21.019 |
| 2005/0098808 A1 | * | 5/2005 | Moon | H01L 28/84 257/295 |

(Continued)

OTHER PUBLICATIONS

Office Action issued in connection with Taiwan Appl. No. 112110766 dated May 29, 2024.

*Primary Examiner* — Nicholas J Tobergte
(74) *Attorney, Agent, or Firm* — FOLEY & LARDNER LLP

(57) ABSTRACT

A semiconductor device includes a first capacitor having a ferroelectric film disposed between two electrodes, a second capacitor, having another dielectric film disposed between two electrodes. A first voltage is applied across the first capacitor such that the ferroelectric film is polarized, altering the effective resistance through the device. A second voltage is applied across the first capacitor, such that a leakage current transits the ferroelectric film, and accumulates along an electrode of the second capacitor, and the gate of a transistor, thereby effecting a change to the drain to source resistance of the transistor which may be measured to determine the polarization state of the ferroelectric film.

20 Claims, 14 Drawing Sheets

(56) References Cited

U.S. PATENT DOCUMENTS

| | | | |
|---|---|---|---|
| 2005/0272170 A1* | 12/2005 | Hayashi | H10B 53/30 |
| | | | 257/E21.018 |
| 2015/0364535 A1* | 12/2015 | Triyoso | H01L 28/40 |
| | | | 257/295 |
| 2020/0373312 A1 | 11/2020 | Sharma | |
| 2021/0090662 A1* | 3/2021 | Mennenga | G11C 11/2259 |
| 2021/0210594 A1 | 7/2021 | Yeong et al. | |
| 2022/0005829 A1* | 1/2022 | Hu | H01L 29/40111 |
| 2022/0392508 A1* | 12/2022 | Li | G11C 11/2273 |
| 2023/0317125 A1* | 10/2023 | Matsuzaki | G11C 11/4096 |
| | | | 365/189.16 |
| 2024/0032306 A1* | 1/2024 | Ocker | H10B 53/30 |
| 2024/0130139 A1* | 4/2024 | Hou | G11C 11/2255 |

* cited by examiner

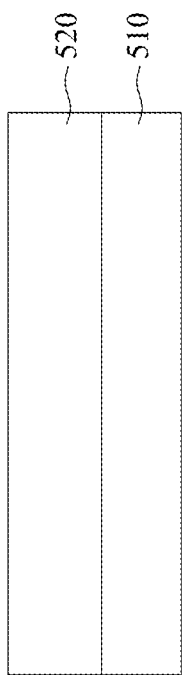
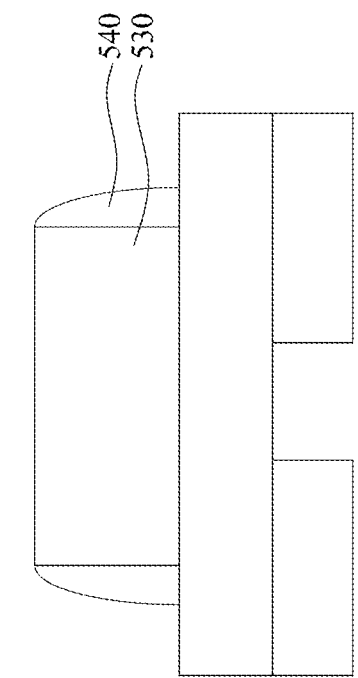
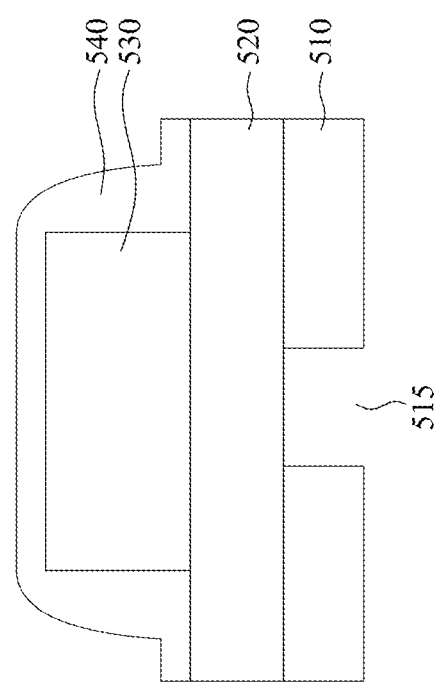
FIG. 5a
FIG. 5b
FIG. 5c

FERROELECTRIC TUNNEL JUNCTION MEMORY DEVICES WITH ENHANCED READ WINDOW

BACKGROUND

Semiconductor devices are ubiquitous in several applications and devices throughout most industries. For example, consumer electronics devices such as personal computers, cellular telephones, and wearable devices may contain several semiconductor devices. Similarly, industrial products such as test instruments, vehicles, and automation systems frequently comprise a large number of semiconductor devices.

Increasingly, power use is becoming a limiting constraint for semiconductor devices. For example, many internet-of-things (IOT) devices may require very low power use to conserve battery power, and many high performance compute (HPC) devices may be thermally constrained in their performance characteristics. Moreover, various semiconductor devices may be limited by available memory quantity, speed, power use, etc.

Some semiconductors devices comprise or interface with DRAM and/or SRAM, which may be capable of high performance, but require power to maintain and/or refresh data. Magnetic storage media, such as rotating magnetic media and FeRAM may maintain memory states for long periods of time, but may be limited in density, performance, etc. Thus, while various sophisticated memories are presently used, further improvements are needed to advance the state of the art.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5a, 5b, 5c, 5d, 5e, 5f, and 5g illustrate cross sectional views of intermediate stages in the formation of an FTJ capacitor, in accordance with some embodiments.

DETAILED DESCRIPTION

Figure 1:
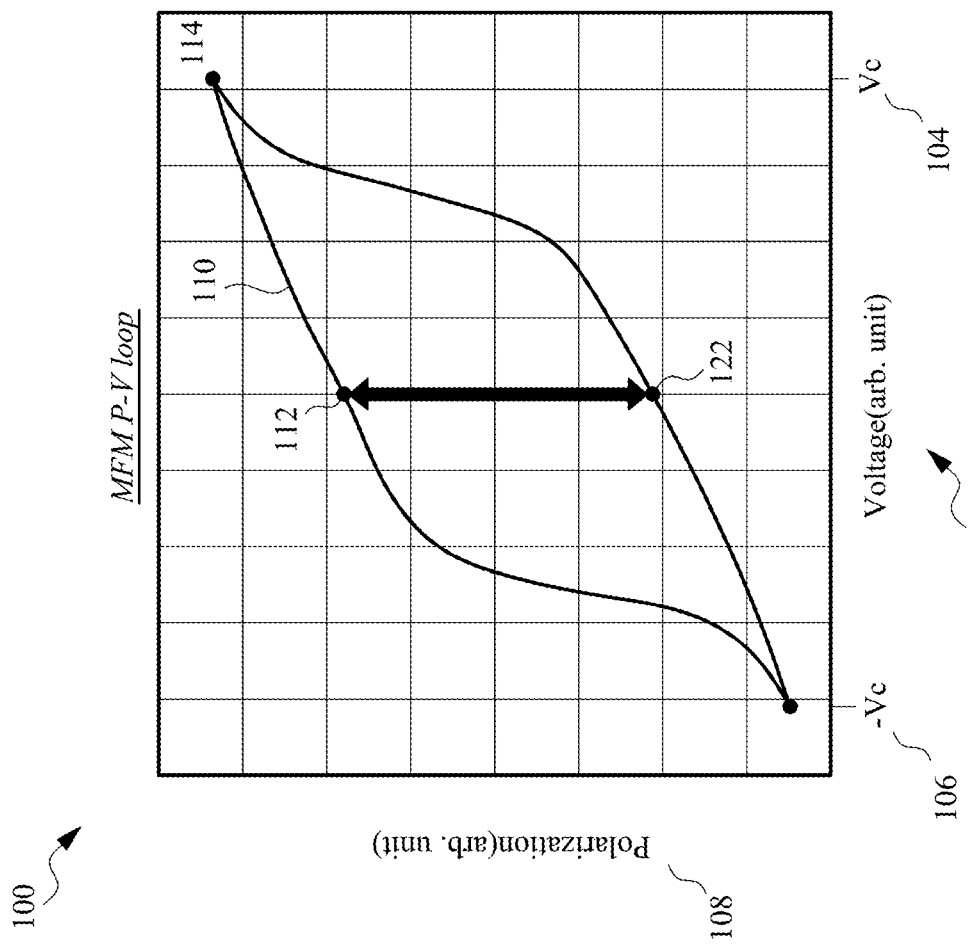
FIG. 1 illustrates a hysteresis loop associated with an FTJ capacitor, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A ferroelectric tunnel junction (FTJ) capacitor (which may also be referred to as a metal-ferroelectric-metal (MFM) capacitor) may be combined with a transistor to store a bit of information (e.g., by applying a voltage to alter the resistance state of the FTJ capacitor and thereafter sensing a difference in current resulting from the state of the FTJ capacitor). In some embodiments, the change in the resistance state of the FTJ capacitor may be relatively small, resulting in low measurement accuracy at a desired read speed, or requiring a longer read time than is desirable to obtain a reliable measurement. The addition of a second capacitor may enable a charge to build at the gate of the transistor, which may thus increase a current (e.g., a read current) passed between the drain and source of the transistor, and thus amplify the measured change in the resistance state. Advantageously, a larger difference between the states of the FTJ capacitor may enable faster or more reliable reads, greater retention time and/or endurance, the resolution of additional bits, etc.

An FTJ capacitor comprises one more layers of a ferroelectric film (e.g., a metal oxide, metal oxynitride, or doped metal oxide), which is disposed between two electrodes, which may be termed as an upper and lower electrode, a top and bottom electrode, a first and second electrode, etc. Such terms are selected merely for ease or reference (e.g., to refer to the electrodes depicted in the figures herein) and without regard to a physical orientation, an order of manufacture, etc. The electrodes may comprise any conductive material including metal, metal nitride, metal oxide, doped polysilicon, etc. The thickness of the ferroelectric film may vary according to an intended application (e.g., applications requiring lower currents or higher voltages may select a thicker film, or a film may be selected according to ease of production). For example, a ferroelectric film may range from 1 nm thickness to 100 nm of thickness. Such a thickness may enable a current to flow through the FTJ capacitor when the top and bottom electrodes are biased to differing voltages (e.g., a tunneling current, another leakage current, or a breakdown current).

A relatively high bias voltage applied between the top and bottom electrodes may result in a breakdown of the dielectric properties of the FTJ capacitor, ($V_{BD}$). A bias voltage applied between the top and bottom electrodes which is less than $V_{BD}$ may impose an electric field on the ferroelectric film sufficient to result in the ferroelectric polarization of the ferroelectric film without dielectric breakdown, and may be termed a coercive voltage, "$V_C$," or a "programming voltage." Such a ferroelectric polarization may impact the leakage current through the ferroelectric film by aligning charge carriers such as electrons and holes along a surface of the film disposed along the top electrode (i.e., the top film surface) or the surface of the film disposed along the bottom electrode (i.e., the bottom film surface) which may increase or decrease the electro-potential barrier for charge carriers to pass through the ferroelectric film. For example, if the top surface of the ferroelectric film is negatively charged, a reduced number of electrons may propagate through the ferroelectric film from the top surface relative to a film surface without a net charge, or with a positively charged top surface. Because such a change is intrinsic to the film layer, the polarization will be at least partially persistent, such that the polarization will remain after the removal of $V_C$.

Because the leakage current of the FTJ capacitor may be altered by the application of one or more $V_C$ values, the FTJ may operate as a memory device. Particularly, the variance of the leakage current may be used to determine a low leakage state, which may be referred to herein as a high resistance state (HRS), and a high leakage state, which may be referred to herein as a low resistance state (LRS). For example, a voltage measured across a transistor or resistor may depend on the current flowing through the FTJ, and thus measure the state of the FTJ. Either of the HRS or the LRS may be assigned to a '1' value, and the other may be assigned to a '0' value. In some embodiments, additional leakage states may be defined, for example, if two medium resistance states are defined, the FTJ capacitor may be configured to store two or more bits of data rather than one, which may increase memory density.

An intermediate value may also be assigned which may indicate an unknown or undefined value (e.g., a memory read error). In order to minimize such errors, (and errors related to a misread of a '1' as a '0' or vice versa) the current through the FTJ may be maximized, such as by the selection of FTJ voltages, materials, and surrounding circuits, or the read and/or write time may be extended. For example, in a memory array comprising a FTJ capacitor, another capacitor may gate various voltages applied to the memory device, and the circuit may be designed (e.g., with a blocking capacitor) to allow the FTJ capacitor leakage current to accumulate at the gate of a transistor, which may amplify the FTJ current (e.g., by lowering an effective resistance between a drain and a source) according to the effective gain of the transistor circuit (e.g., 2×, 10×, 50×, 200× etc.).

FIG. 1 illustrates a hysteresis loop 100 associated with an FTJ capacitor, in accordance with some embodiments. The application of a coercive voltage (i.e., $V_C$) across the electrodes of the FTJ capacitor may result in polarization of the ferroelectric film. The voltage axis 102 may be centered around any voltage, but in many embodiments will be centered around 0 volts and FIG. 1 will be referred to thusly. Applying a positive voltage to the FTJ, such as $V_C$ 104, may saturate the polarization of the device, illustrated by a saturation point 114 on the hysteresis loop 100, such that additional voltage may not result in substantial additional polarization. Another voltage (e.g., a voltage twice the magnitude of $V_C$) may result in a breakdown of the dielectric properties of the FTJ (i.e., may be $V_{BD}$). In some embodiments, $V_{BD}$ may be very close to $V_C$. In some embodiments, the voltage of the saturation point 114 may exceed that of $V_{BD}$, wherein a $V_C$ of lesser amplitude than the saturation voltage may be selected, in order to avoid breakdown of the FTJ. In some embodiments where $V_{BD}$ exceeds the saturation voltage, a $V_C$ may be selected in excess of the magnitude of the voltage of the saturation point 114. One skilled in the art will understand that adjusting the applied $V_C$ 104 upward (i.e., approaching or exceeding the saturation point 114), may ensure a complete polarization of the device (which may result in increased performance and/or reliability), and adjusting the amplitude of the applied $V_C$ 104 downward (i.e., increasing a margin to $V_{BD}$) may increase device longevity (e.g., may avoid electro-migration failures).

Following the application of $V_C$ 104 to the ferroelectric film (i.e., by applying the voltage to two electrodes disposed on opposite sides of the film), $V_C$ may be removed from the FTJ. For example, the circuit may be opened, and the charges disposed along the two electrodes may gradually leak to normalize the voltage, or the FTJ may be grounded (i.e., a ground voltage may be applied thereto). Upon reaching a ground state, the hysteresis loop 100 may relax to a polarization point 112 (i.e., along the upper surface 110 of the hysteresis loop 100). The application of a lower or higher voltage may result in a somewhat lower or higher polarization. Thus the application of a plurality of magnitudes of $V_C$ may result in a plurality of respective positive polarization point 112 values along a polarization axis 108. A plurality of discrete bit values, or a continuous value (e.g., an analog value or an undefined value used to generate random numbers) may be stored on the ferroelectric film. In some embodiments, a voltage may be applied to the FTJ for an insufficient time to complete polarization, and thus polarization may also be controlled.

Application of a negative $V_C$ 106 may polarize the FTJ to a negative polarization point 122 when in a relaxed (e.g., ground) state. In some embodiments, the negative polarization point 122 and positive polarization point 112 may correspond to a logical '1', and '0'. In some embodiments, the FTJ may be symmetrical or substantially symmetrical, wherein the magnitude of $V_C$ 104 and $-V_C$ 106 may be equal or substantially equal, whereas in other embodiments, the magnitude of $V_C$ 104 may be substantially higher or lower than the magnitude of $-V_C$ 106. In some such embodiments, $V_C$ may be applied directly to FTJ capacitor, and the difference in magnitude between $V_C$ 104 and $-V_C$ 106 may be due to intrinsic properties of the ferroelectric film. Alternatively or additionally, asymmetries between $V_C$ 104 and $-V_C$ 106 may be a result of additional circuit elements, such as a current sense resistors, capacitors, protection diodes, etc., which $V_C$ 104/or and $-V_C$ 106 may be applied to. Although $V_C$ 104 and $-V_C$ 106 may vary in amplitude and may comprise many values, $V_C$ may be referred to generally herein, as to relate to any coercive voltage which may be intended to adjust the polarization of the FTJ (e.g., a positive or negative value).

Figure 2:
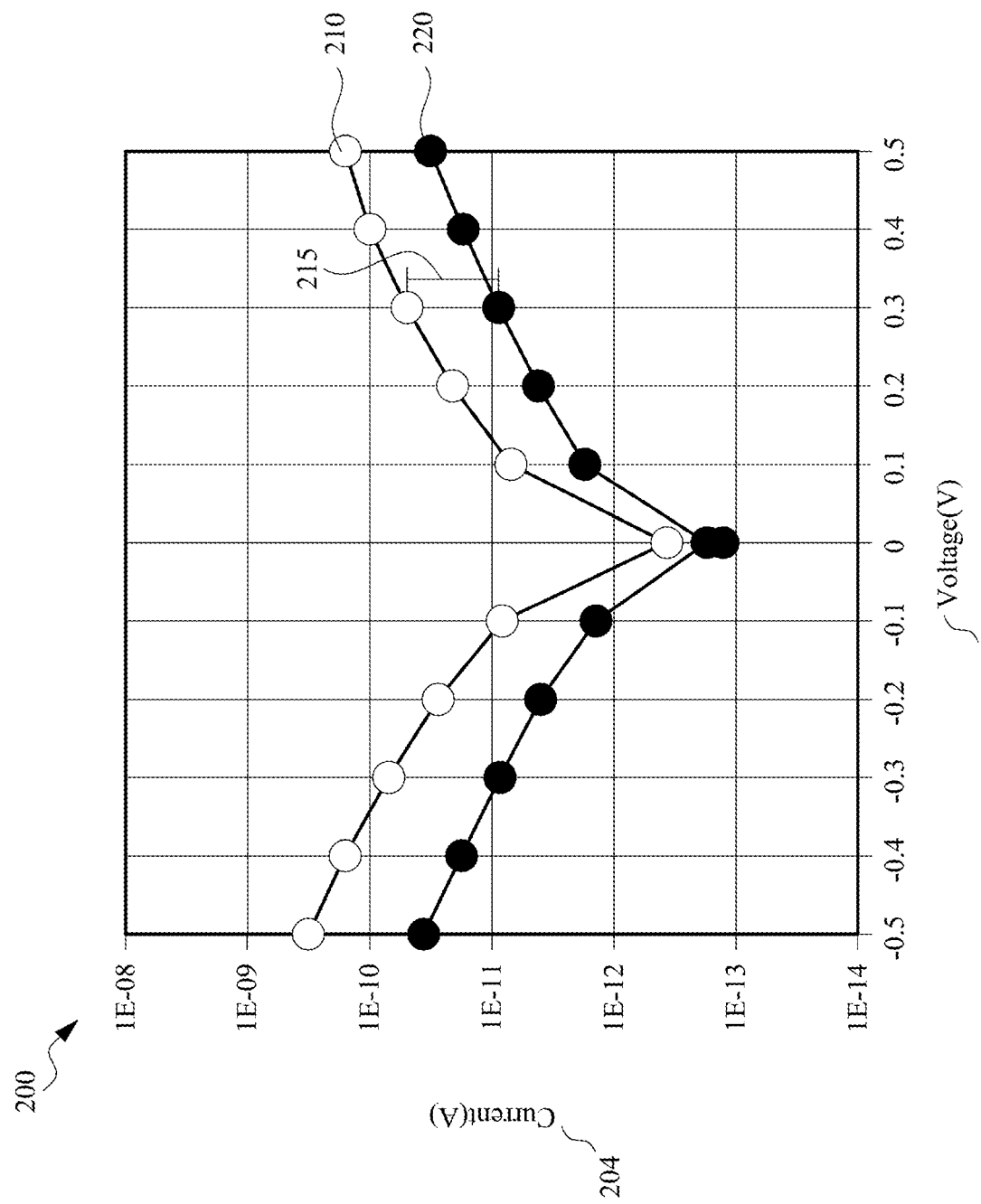
FIG. 2 illustrates a I-V chart associated with an FTJ capacitor, in accordance with some embodiments.

FIG. 2 is an I-V chart 200 associated with a FTJ capacitor, in accordance with some embodiments. A voltage axis 202 spans an operational range, which may be associated with various embodiments of the FTJ capacitor. Other embodiments may have a large, narrower, or offset operational voltage range. A current axis 204 is provided to demonstrate the current that results from various voltages. A first plot 210 demonstrates the I-V characteristics of a particular FTJ capacitor in a LRS, and a second plot 220 demonstrates the I-V characteristics of the same FTJ capacitor in a HRS. A read window 215 is defined as a difference in the I-V characteristics between the LRS and HRS. For example, at 0.3V, (applied across the FTJ) the FTJ passes about 10 pico-amps in a HRS, and about 50 pico-amps in a LRS. The read window 215 is defined as 40 picoamps, which may be difficult to measure quickly and accurately.

In accordance with various embodiments of the present disclosure, greater currents and/or greater differentiation between the HRS and LRS states may be present by using the structure of a memory cell, as herein disclosed. For example, various embodiments of a memory cell structure disclosed by FIGS. 3a and 3b may result in greater currents and greater differentiation between the HRS and LRS states. For example, reducing the HRS current to 5 pico-amps, or increasing the LRS current to 1 micro-amp may simplify the amplification/detection circuitry needed to discriminate between a LRS and a HRS and/or improve device performance.

Figure 3B:
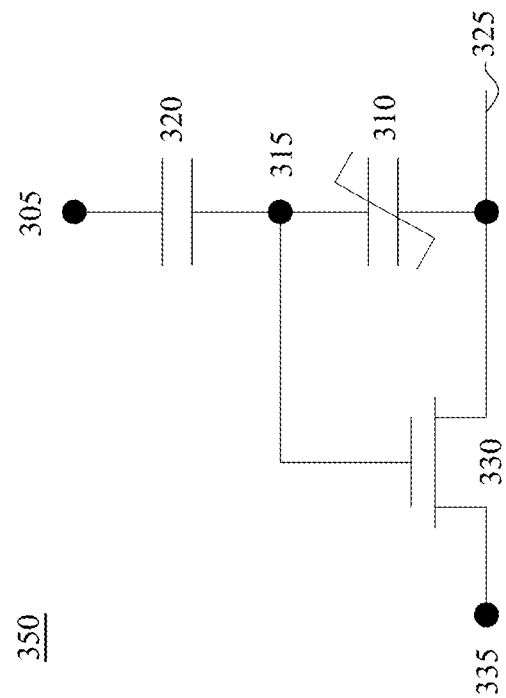
FIGS. 3a and 3b are schematic representations of memory cells, in accordance with some embodiments.
Figure 3A:
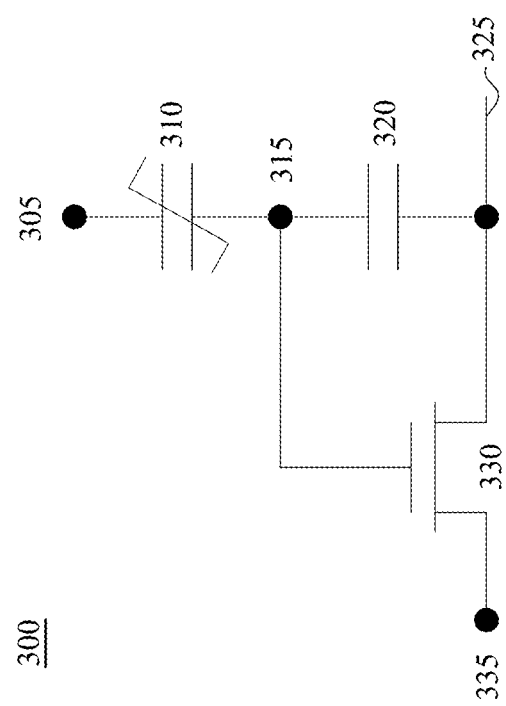

FIG. 3a is a schematic representation of a memory cell 300, in accordance with some embodiments. A first capacitor 310 (i.e., an FTJ capacitor) is connected to the gate of a transistor by a bottom electrode, and to a bit line 305 by the top electrode. The transistor may be an n-channel field effect transistor, such as an nMOSFET. One skilled in the art will understand that various transistors may be employed mutatis mutandis (e.g., may optionally reverse the source and drain for a pMOSFET). The source (or drain) of the transistor is shown coupled to a source line 335, and the drain (or source) is shown coupled to a word line 325. The word line 325 is also shown coupled to a bottom electrode of a second capacitor 320, which may be of any type, but is depicted as a metal-insulator-metal (MIM) capacitor (i.e., a dielectric disposed between a pair of electrodes), wherein a top electrode of the second capacitor 320 is connected to the gate of the transistor 330, and to the bottom electrode of the first capacitor 310, defining a node, $V_g$ 315.

Upon the application of a voltage, $V_C'$ between the bit line 305 and the word line 325, $V_C$ is imposed across a ferroelectric film of the FTJ capacitor (i.e., the first capacitor 310), and a remainder voltage, $V_C''$ (i.e., $V_C'-V_C$) is imposed across the second capacitor 320. Thusly, $V_C$ may polarize the FTJ capacitor, such that a leakage current may be controlled (e.g., by polarizing the FTJ capacitor to the positive polarization point 112, or negative polarization point 122 of FIG. 1). In some embodiments, the capacitor value of the second capacitor 320 may be substantially larger than the capacitance of the FTJ capacitor (e.g., by use of a high-k dielectric, based on the geometry of the second capacitor 320, etc.), to maximize the portion of $V_C'$ imposed across the FTJ capacitor (i.e., $V_C$), and thus minimize the remainder voltage imposed across the second capacitor (i.e., $V_C''$), which may reduce power use of the circuit. For example, the second capacitor 320 may be greater than about 5 or 10 times the capacitance of the first capacitor 310. In some embodiments, the capacitance of the second capacitor 320 may be minimized, which may decrease the energy stored in the second capacitor 320. In some embodiments, the value of the second capacitor may be selected based on an available supply voltage. For example, if a voltage of about 900 mV is available, and a $V_C$ of about 450 mV is desired, a second capacitor 320 having similar capacitance as the first capacitor 310 may be selected. As one skilled in the art will understand, various applications may employ various components. For example, an embodiment in which the FTJ capacitor is used as a memory cell in a memory array which is intended to be frequently read, but rarely written to may optimize the circuit for read operation, whereas a memory intended to be frequently written to may be optimized for write power efficiency.

Following an application of a $V_C$ value to the FTJ capacitor resulting in a LRS state, the state of the capacitor may be sensed. A read voltage is applied to the bit line 305, wherein the leakage of current through the FTJ capacitor accumulates a charge on the transistor gate 315. A bias voltage may be applied between the and drain and source (e.g., the word line 325 and the source line 335), and the resulting current may be sensed (e.g., the voltage across a current sense resistor may be latched into a memory bus, may be input into a circuit for further amplification, etc.). Subsequently or previously, a different $V_C$ may be imposed across the FTJ capacitor to place the FTJ capacitor into a HRS, which, when similarly measured, results in the accumulation of fewer charge carriers at $V_g$ 315, and thus the transistor may further limit the flow of current between the source and drain, which may be sensed and resolved to a logical value (e.g., '1', or '0').

Various numerical values are hereinafter presented merely to demonstrate one example of operation, and may vary based on a process, longevity, read and write performance, etc. Indeed, the numbers presented in this example are selected for their simplicity, and do not necessarily relate to any particular embodiment. A $V_C$ of 2V is imposed over the FTJ capacitor, to place it into a LRS state. A read voltage of 1V is thereafter applied to the bit line 305, which results in charge passing through the FTJ capacitor and collecting at $V_g$ 315, which charges the gate to 500 mV, resulting in a $R_{DS}$ of 100Ω. If a bias voltage of 100 mV is connected to the word line 325, and the source line 335 is grounded, the transistor may allow 1 mA of current to flow between the source and the drain, and through the source line, which is thereafter measured as a logical '1.' Alternatively, subsequently, or previously, another $V_C$ is imposed over the FTJ capacitor, to place it into a HRS state. A read voltage of 1V is applied to the bit line 305, which results in charge passing through the FTJ capacitor and collecting at $V_g$ 315, which charges the gate to 10 mV, resulting in a $R_{DS}$ of 100MΩ. If a bias voltage of 100 mV is connected to the word line 325, and the source line 335 is grounded, the transistor may allow 1 na of current to flow between the source and the drain, and through the source line 335, which is thereafter measured as a logical '0.'

In many embodiments, the second capacitor 320 may be of different construction than the first capacitor 310. For example, the dielectric of the second capacitor may comprise a traditional dielectric. Advantageously, such an embodiment may minimize leakage through the second capacitor, which may result in increased charge accumulated at $V_g$ 315 during memory reads. Many embodiments may use a high-k dielectric, which may, advantageously, result in a much higher capacitance in the second capacitor 320, which may result in a lower voltage across the second capacitor 320, and lower write power. The use of various dielectrics may enable a desired capacitance to be made in a similar physical dimension as the FTJ capacitor. For example, if the first capacitor 310 is formed in a metallization layer of a semiconductor device, the second capacitor 320 may be similarly formed, and the use of another dielectric material may result in a substantially divergent (e.g., higher or lower) capacitance.

FIG. 3b is another schematic representations of a memory cell 350, in accordance with some embodiments. The memory cell is similar to the memory cell of FIG. 3a, except that the positions of the first 310 and second 320 capacitors are reversed. Write operations proceed similarly, wherein $V_C'$ is imposed across the bit line 305 and the word line 325, resulting in a $V_C$ being applied across the first capacitor 310 (i.e., the FTJ capacitor), and a remainder voltage $V_C''$ (i.e., $V_C'-V_C$) imposed across the second capacitor 320. During a read operation, the voltage applied to the word line 325 may result in current leaking (e.g., tunneling) through the first capacitor 310 to accumulate a charge at $V_g$ 315, which may lower an effective $R_{DS}$ of the transistor, resulting in a larger current which may thereafter be detected to determine the state of the ferroelectric film of the FTJ capacitor in order to determine a memory value. Alternatively, or in addition, a voltage may be applied to the bit line 305, which may also result in a relative decrease/increase of the $R_{DS}$ of the transistor 330, which may similarly be sensed and resolved to a digital value.

Figure 4A:
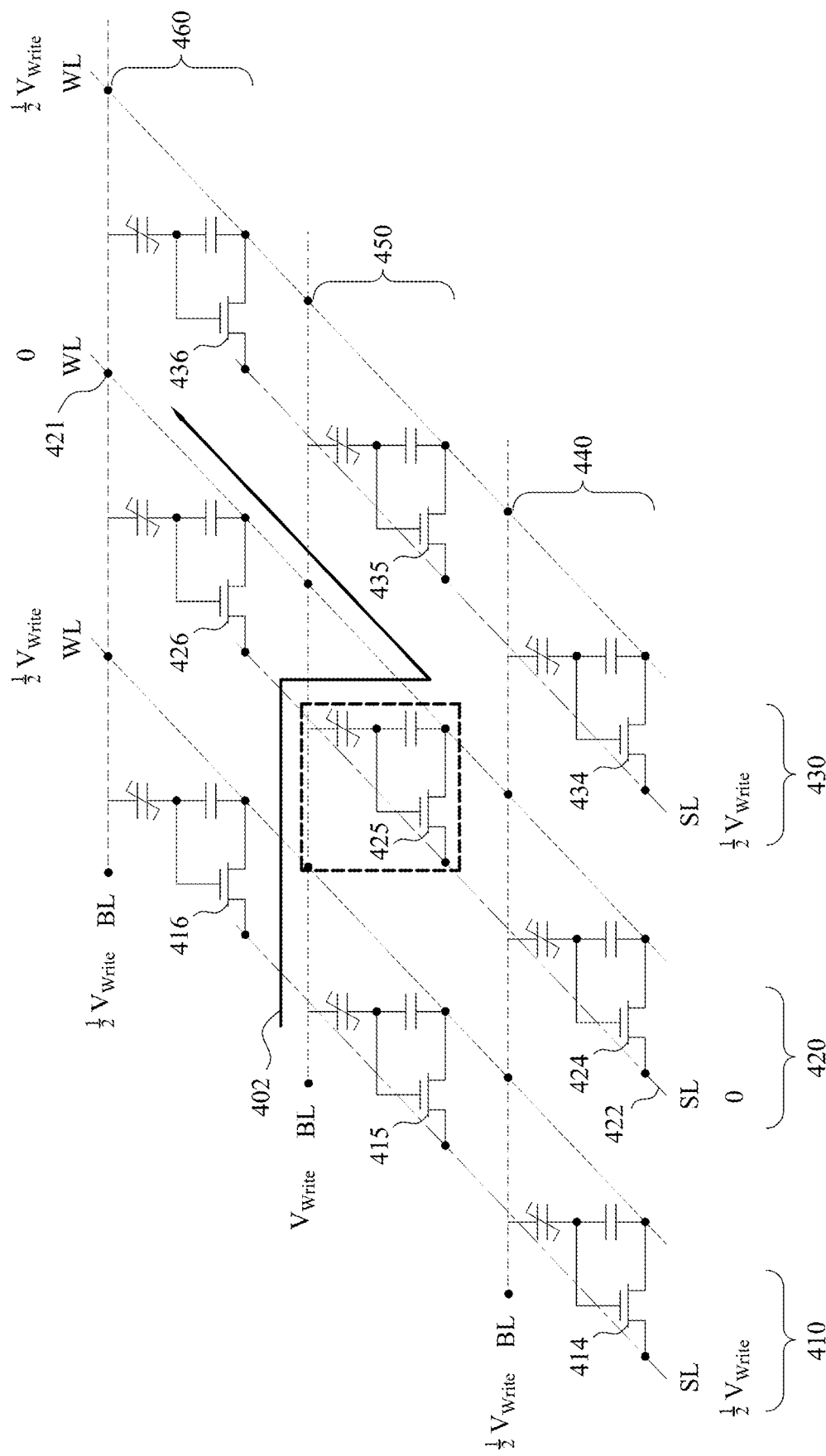
FIGS. 4a and 4b are schematic representations of arrays of memory cells, in accordance with some embodiments.

FIG. 4a is a schematic representation of an array of memory cells, in accordance with some embodiments. One skilled in the art will understand that some embodiments may comprise additional or fewer memory cells, or comprise memory cells of a different type. A plurality of memory cells (e.g., the memory cell 300 of FIG. 3a) are aligned into a first row 410 (comprising three memory cells 414, 415, and 416) a second row 420 (comprising three memory cells 424, 425, and 426) and a third row 430, (comprising three memory cells 434, 435, and 436), wherein the word lines and select lines of memory cells are shared within each row. For example, the second row comprises a second word line 421 and a second select line 422. The memory cells are also arranged into a first column 440 (comprising three memory cells 414, 424, and 434), a second column 450 (comprising three memory cells 415, 425, and 435), and a third column 460 (comprising three memory cells 416, 426, and 436), wherein a bit line of memory cells are shared within each column. For example, the second column comprises a second bit line 455. Advantageously, such a circuit may avoid duplication of the bit sensing and/or amplification circuitry, the interfaces with memory bus latches, etc (not depicted).

A write path 402 is depicted along the second row 420 and the second column 450, targeting a memory cell 425. Voltages are applied to avoid incidental writes to memory cells that are not targeted to be written, and errant reads from memory cells not targeted to be read. For example, applying a write voltage (i.e., $V_C'$) to a column of memory cells may place every memory cell of that column into a particular state. While such a result may sometimes be desirable (e.g., a block erase), frequently, such a result may over-write valuable data. Thus, when applying a write voltage to the bit-line, the word line associated with the memory cell may be grounded, whereas the word line of every other row of the memory device may be set to a value between zero and $V_C'$ (e.g., $V_C'/2$). Such a voltage may result in a voltage of about $V_C/2$ over the ferroelectric film of the FTJ capacitor, which may be inadequate to substantially modify the polarization of the ferroelectric film, and thus make no persistent effect on the state of the FTJ capacitor.

In some embodiments, the select lines may also be raised to a value between zero and $V_C'$. Advantageously this may result in a low $V_{DS}$ (e.g., 0 volts) across the transistor, and a corresponding low $I_{DS}$ current (e.g., 0 nA). In other embodiments, the select line may be grounded or allowed to float. Advantageously, such circuits may simplify implementations, and various associated sensing circuits may discriminate between the stray $I_{DS}$ currents, and a larger $I_{DS}$ current associated with a targeted memory cell 425.

Figure 4B:
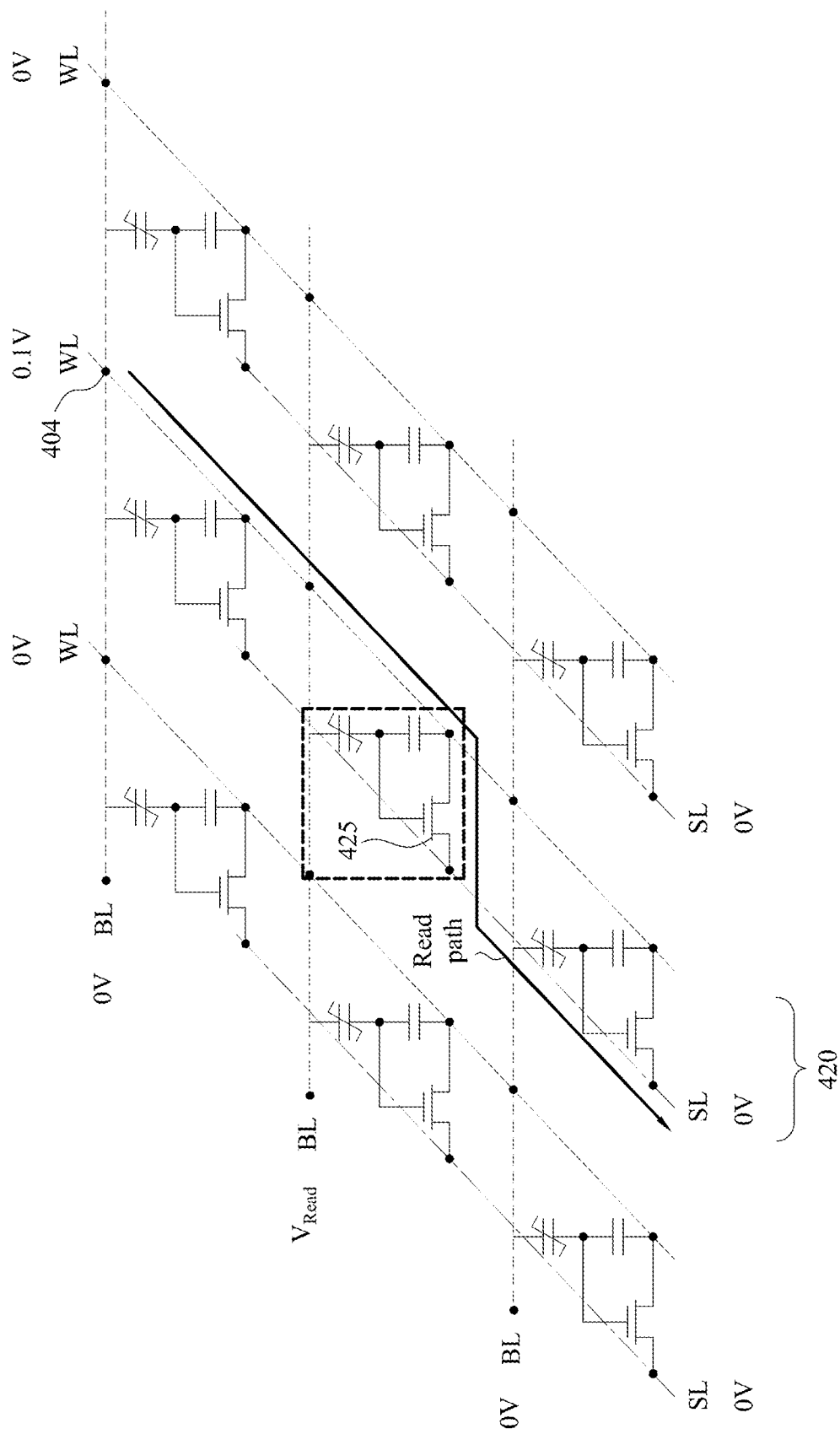

FIG. 4b is a schematic representation of an array of memory cells, in accordance with some embodiments. For example, the array may be the same array as FIG. 4a. A read path 404 is depicted passing along the second column 420, wherein as read voltage is applied to the second column 420 such that $V_g$ of memory cell 425 is charged arranging to the resistance state of the FTJ capacitor thereof, so that an $I_{DS}$ current passing along the read path 404 is varied according to the resistance state, and can thus be resolved by additional circuitry (not depicted) to determine a logical value. Although a read voltage is applied to every memory cell connected to the bit line, only the targeted memory cell 425 also has a word line bias applied.

Figure 5E:
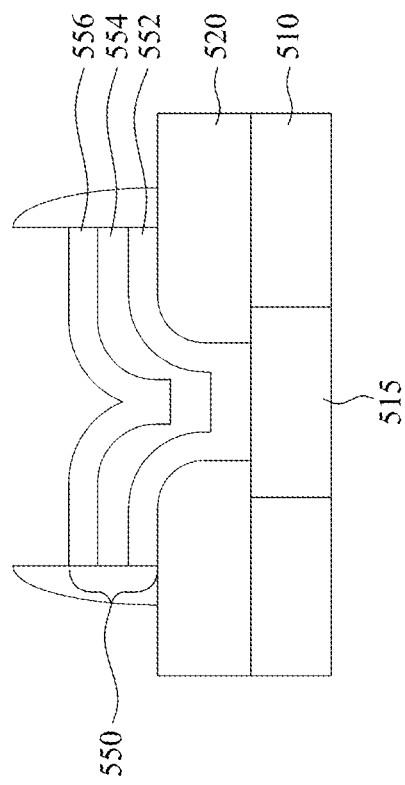
Figure 5D:
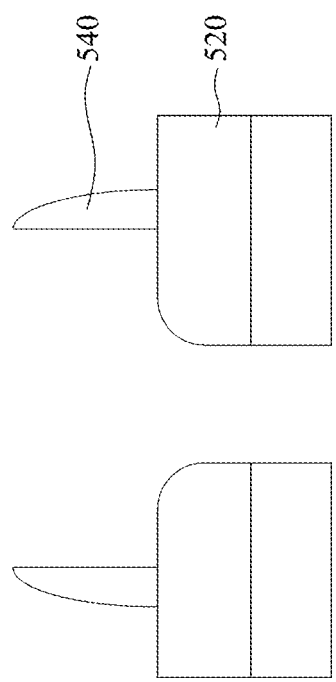
Figure 5G:
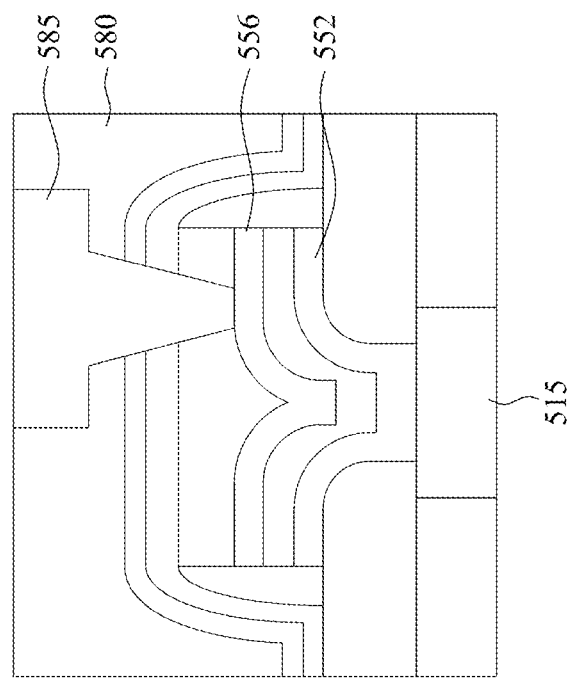
Figure 5F:
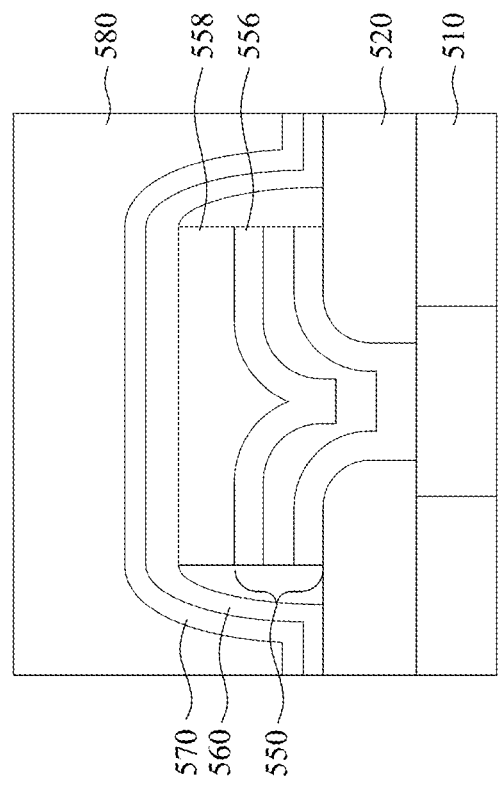

Referring now to FIG. 5f, a hard mask 558 is formed over the upper electrode 556 (e.g., in order to protect the metallic upper electrode), and the FTJ capacitor 550 is surrounded by an etch stop film 560 and buffer film 570. A second dielectric layer 580 (e.g., an extreme low-k dielectric) is then formed over the surface of the device. The second dielectric layer 580 may be the same as the first interlayer surface 510 and/or the first dielectric layer 520, which may minimize process steps, or may be differently formed. Advantageously, embodiments using different materials may enable the integration of extreme low-k dielectrics which may be unsuitable for other portions of the device (e.g., due to insulative properties, effects of etches or other substractive processes, mechanical strength, proximity to corrodible surfaces, etc.). In some embodiments, the etch stop film 560 and buffer film 570 may be omitted, depending on the selected materials. For example, in some embodiments wherein the second dielectric layer 580 is selected from a porous extreme low-k dielectric, the etch stop film 560 and buffer film 570 may be included to protect the second dielectric layer 580, or to protect other device materials from the second dielectric layer 580 (e.g., from corrosive outgassing), and various working materials (e.g., etches) used to form the second dielectric layer 580. In some embodiments wherein the second dielectric layer 580 is $SO_2$, one or more of the hard mask 558, the etch stop film 560, or the buffer film 570 may be omitted.

Referring now to FIG. 5b, the interlayer surface 510 is depicted as having a first opening 515 for a via. The via may be, for example, within a metallization layer of a semiconductor device, and the via may connect the depicted metallization layer to an active surface of a semiconductor device (e.g., through a plurality of additional layers). A first mandrel 530 is also depicted, which may be placed, formed, etc. In some embodiments, the first mandrel 530 may be formed across the surface of the first dielectric layer 520, and selectively removed (e.g., by a subtractive process such as etching) to form the depicted features. The first mandrel 530 may thereafter be covered in a spacer material 540, which may be deposited along a surface of the depicted device unevenly (e.g., with greater thickness along the outer edges of the first mandrel 530 as viewed in a downward direction, as illustrated).

Referring now to FIG. 5c, a portion of the spacer material 540 may be removed, such as by a time and/or light controlled etching process which may be configured to remove a desired thickness of the spacer material 540, leaving a pair of spacers, separated by the first mandrel 530. FIG. 5d depicts the removal of the mandrel (e.g., by a process which does not remove substantial portions of the remaining spacer material 540). A portion of the first dielectric layer 520 is also depicted as eliminated via a subtractive process (e.g., etching, drilling, etc.).

Referring now to FIG. 5e, the first opening 515 is filled with a conductive material (e.g., aluminum, copper, etc.) and the an FTJ capacitor 550 comprising a bottom electrode 552, a ferroelectric film 554, and an upper electrode 556 is formed over the surface of the device. As illustrated, the first dielectric layer 520 exhibits rounded corners (e.g., due to over-etch) which may, advantageously, increase the surface area of the junctions between the upper 556 and lower electrodes 552, and the ferroelectric film 554, which may increase the capacitance and potential polarization of the device, and minimize the surface area occupied by the device, which may lead to improved density. In some embodiments, the FTJ capacitor 550 may be formed directly over the interlayer surface 510, and the first dielectric layer 520 may be omitted (or vica versa). Advantageously, such embodiments may be manufactured using fewer operations.

Referring now to FIG. 5f, a hard mask 558 is formed over the upper electrode 556 (e.g., in order to protect the metallic upper electrode), and the FTJ capacitor 550 is surrounded by an etch stop film 560 and buffer film 570. A second dielectric layer 580 (e.g., an extreme low-k dielectric) is then formed over the surface of the device. The second dielectric layer 580 may be the same as the first interlayer surface 510 and/or the first dielectric layer 520, which may minimize process steps, or may be differently formed. Advantageously, embodiments using different materials may enable the integration of extreme low-k dielectrics which may be unsuitable for other portions of the device (e.g., due to insulative properties, effects of etches or other substractive processes, mechanical strength, proximity to corrodible surfaces, etc.). In some embodiments, the etch stop film 560 and buffer film 570 may be omitted, depending on the selected materials. For example, in some embodiments wherein the second dielectric layer 580 is selected from a porous extreme low-k dielectric, the etch stop film 560 and buffer film 570 may be included to protect the second dielectric layer 580, or to protect other device materials from the second dielectric layer 580 (e.g., from corrosive outgassing), and various working materials (e.g., etches) used to form the second dielectric layer 580. In some embodiments wherein the second dielectric layer 580 is $SO_2$, one or more of the hard mask 558, the etch stop film 560, or the buffer film 570 may be omitted.

Referring now to FIG. 5g, a second opening 585 is created in the second dielectric layer 580 which is thereafter filled with a conductive material, (e.g., a similar material used to fill the first opening 515) such that each of the lower electrode 552 and upper electrode 556 may be connected to an upper and lower surface of the depicted layer, respectively. For example, either electrode may be connected to additional vias, pads, balls, bond wires, active surfaces of semiconductor chips, etc. For example, the electrodes may be connected, through one or more additional vias, to a transistor formed on an active surface of a semiconductor chip and a capacitor (e.g., a capacitor formed in a metallization layer of a semiconductor device, or a deep trench capacitor formed on an active surface of a semiconductor chip).

Figure 6:
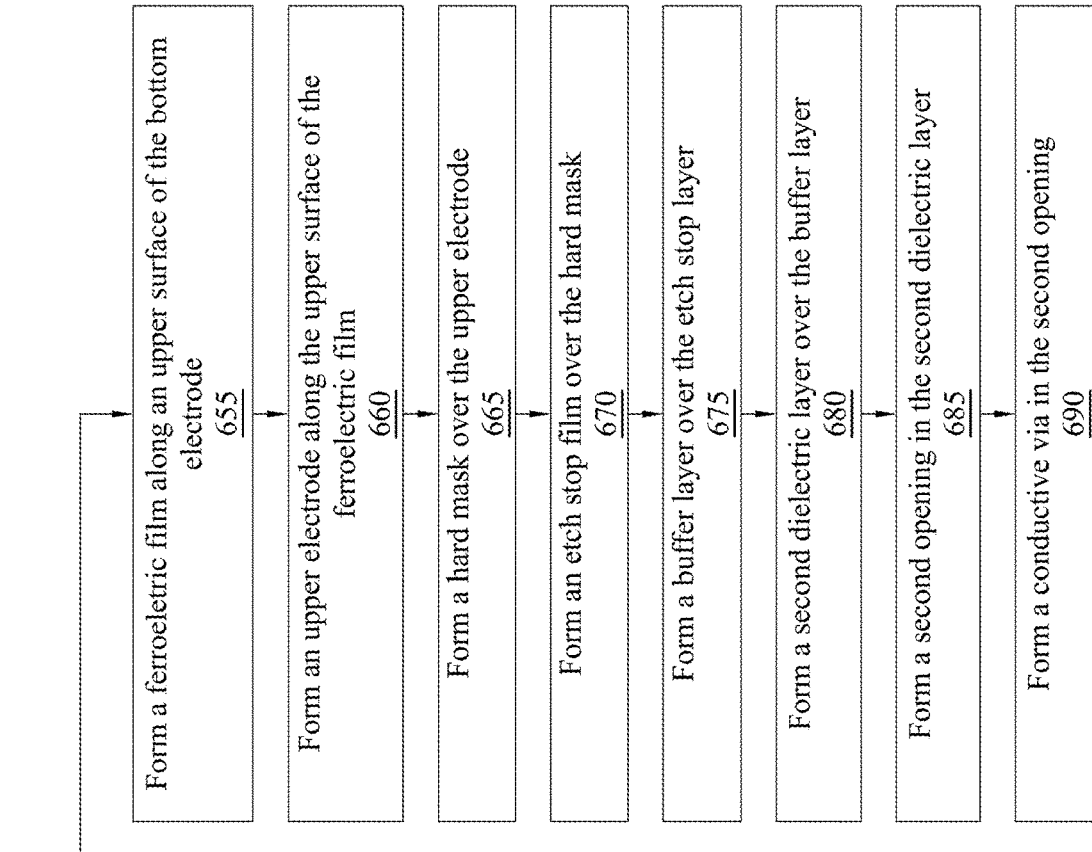
FIG. 6 includes a flowchart of an example method of fabricating an FTJ capacitor, in accordance with some embodiments.
Figure 6:

FIG. 6 includes a flowchart of an example method 600 of fabricating an FTJ capacitor, in accordance with some embodiments. The method 600 may be used to fabricate an FTJ capacitor along a metallization layer of a semiconductor device. For example, at least some of the operations described in the method 600 may result in the FTJ capacitor or semiconductor devices depicted in FIGS. 5a-5g and 9, respectively. The disclosed method 600 is a non-limiting example; additional operations may be provided before, during, and after the method 600 of FIG. 6. Further, some operations may only be described briefly herein, however, one skilled in the art will understand that the disclosed operations may be performed in conjunction with other disclosed methods disclosed herein, or generally known in the art. For example, one skilled in the art will understand that the various additive and subtractive processes disclosed herein may be substituted to generate similar features, and may contain sub-operations which are not explicitly recited, but may nonetheless be understood as implicit in the method disclosed herein.

At operation 605 an interlayer surface is formed. At operation 610, a first dielectric layer is formed over the interlayer surface. A first opening is formed in the interlayer surface at operation 615, and a first mandrel is formed along an upper surface of the first dielectric layer at operation 620. At operation 625, a layer of spacer material is formed over the first mandrel, and a portion of that spacer material is thereafter removed during operation 635. At operations 640 and 645, respectively, the first mandrel and a portion of the first dielectric are removed. At operation 650, a bottom electrode is formed along an upper surface of the first opening. At operation 655, a ferroelectric film is formed along an upper surface of the bottom electrode; an upper electrode is formed over the ferroelectric film at operation 660. At operation 665, a hard mask is formed over the upper electrode. At operations 670 and 675, respectively, an etch stop layer and a buffer layer are formed over the upper electrode. At operation 680, a second dielectric layer is formed over the buffer layer. An opening is formed in that dielectric layer at operation 685, and a conductive via is formed therein at operation 690.

At operation 605, a first interlayer surface is formed. The first interlayer surface may be formed upon or within another layer of a semiconductor or other device, or may be formed on another surface, such as a substrate, which may include an intermediate layer to detach the first interlayer surface therefrom. In many embodiments, the first interlayer surface may be an oxide of silicon, which may be broadly compatible with other materials, and avoid excessive capacitance. In some embodiments, the interlayer surface may be a polymer, low-k dielectric which may, advantageously, avoid stray capacitance. In some embodiments, the interlayer surface may be conductive, such as a metal, which may electrically connect to the vias of the FTJ capacitor. For example, the interlayer surface may be a power or ground plane.

At operation 610, a first dielectric layer may be formed over the interlayer surface. The first dielectric layer may be selected to avoid capacitance with the electrodes of the FTJ capacitor. For example, the first dielectric layer may be Silicon Carbide or another low-k dielectric which may be interfaced with the first interlayer surface, which may comprise intermediate layers such as buffer layers. At operation 615, a first opening is formed in the first dielectric layer. In some embodiments, the opening may be formed concurrently with removal of material of operation 645 which may, advantageously, minimize the complexity of the method 600. In other embodiments, the operations may be completed separately, which may enable the use of different conductive materials for a via formed in the interlayer surface and the bottom electrode of operation 650.

At operation 620, a first mandrel is formed along an upper surface of the first dielectric layer. The mandrel may be added selectively, or may be added to an entire surface of the layer, and selectively removed. At operation 625, a layer of spacer material is formed thereupon. At operation 635, a portion of the spacer material is removed, which may selectively leave a portion, such as a portion which was deposited thicker than the removed portions, or a portion which is otherwise not removed by selective resist or etching processes. At operation 640, the mandrel is removed. In some embodiments, the spacer material is deposited directly and selectively (e.g., by a process having lithographic resolution sufficient to place a desired spacer material), thus the forming of a mandrel at operation 620 to control placement of the spacer material, and the removal of the first mandrel at operation 640 may be unnecessary.

At operation 645, a portion of the first dielectric layer is removed, which may allow for the formation of a capacitor along the remaining surface. In some embodiments, the removal may result in a curved portions, vertical portion, horizontal portion, etc. due to a concave or convex shape, a serpentine or sinusoidal pattern, etc., any of which may increase a surface area of a capacitor formed generally along the surface of the first dielectric layer. At operation 650, a bottom electrode is formed along an upper surface of the first opening, such that the bottom electrode is (or is configured to be) connected to a via placed (or configured to be placed) in the first opening of the first dielectric layer and/or the first interlayer surface. In some embodiments, the electrode and the via may be the same material, and may be placed in one or more processes. At operation 655, an ferroelectric film is formed along an upper surface of the bottom electrode. The ferroelectric film may generally conform to the surface of the bottom electrode, and be of relatively uniform thickness. The film may be grown upon the electrode, which may comprise one or more intermediate operations or sub operations, or may be manufactured separately, and placed, thereafter, onto the bottom electrode.

At operation 660, an upper electrode is formed along an upper surface of the ferroelectric film. The upper electrode may be of a similar or dissimilar material as the lower electrode. In some embodiments, the upper electrode may be of uniform thickness, and conform to contours (if present) in the ferroelectric film. For example, an atomic layer deposition process may result in uniform thickness of the upper electrode, which follows the contours of the ferroelectric film. In some embodiments, the upper electrode may be formed with a uniform upper surface (e.g., a pouring process or certain deposition processes). In some embodiments, the upper electrode may initially be deposited by a process which follows the contours of the ferroelectric film, and is thereafter processed (e.g., by a chemical-mechanical grinding/polishing process) to form a smooth upper surface of the upper electrode. In some embodiments, the ferroelectric film may be generally flat, and thus any of the disclosed process may result in a generally flat surface of the upper electrode.

At operation 665, a hard mask is formed over the upper electrode. The hard mask may protect certain portions of the FTJ capacitor from subtractive processes used herein. For example, the hard mask may be formed prior to the spacer material, such that the upper electrode is protected during the removal of the excess spacer material. In some embodiments, the hard mask may be removed, prior to subsequent process steps which may, advantageously, minimize the Z-height of the layer, or increase the area available for a material having a lower dielectric constant than the hard mask, in order to minimize stray capacitance.

At operation 670, an etch stop film (e.g., Silicon Nitride) is formed over the hard mask and/or the upper electrode. In some embodiments, the etch stop film may be a low-k etch stop (e.g., may comprise silicon carbide). At operation 675, a buffer layer is formed over the etch stop film, which may mate the buffer structure of an extreme low-k dielectric to an underlying layer, such as the etch stop film, hard mask, or upper electrode. One skilled in the art will understand that various intermediate layers such as the etch stop film, buffer layer, barrier layers, hard mask, etc. may be omitted or inserted between various disclosed layers, according to a selected process and material.

At operation 680, a second dielectric layer is formed over the buffer layer. In many embodiments, the second dielectric layer is an extreme low-k dielectric, selected to avoid stray capacitance with adjacent structures (e.g., additional FTJ capacitors, vias, redistribution structures, etc.). In some embodiments the second dielectric layer may be a traditional dielectric, which may, advantageously, increase mechanical strength, minimize processing steps, etc. For example, some embodiments may be of sufficiently low density, be disposed within a sufficiently thick layer, may be disposed adjacent to a keep out area of low metallization, etc., or the device may operate within specifications with relatively high parasitic capacitance levels.

At operation 685, an opening is formed in the second dielectric layer. The opening may be formed by drilling, laser ablation, etching, or otherwise. In some embodiments, the opening may be formed by a plurality of methods which may, advantageously, be selected to operate along various materials or near interfaces thereof. For example, if the opening is also extended through the hard mask layer, the opening may be formed by a different etchant, resist, etc. than the second dielectric layer. In some embodiments, the opening may be formed in a single operation, in other embodiments, the opening may be formed by a plurality of operations (e.g., performed in immediate succession or interspersed between various operations).

At operation 690, a conductive via is formed in the second opening. In some embodiments, such as those wherein the bottom electrode does not extend through the interlayer surface, a conductive via may also be formed in the first opening, (e.g., simultaneously or with various intermediate operations). The conductive via may be formed of any conductive material such as aluminum, copper, gold, tungsten, or alloys or other combinations thereof. The conductive via may interface with additional layers of the semiconductor device.

Figure 7C:
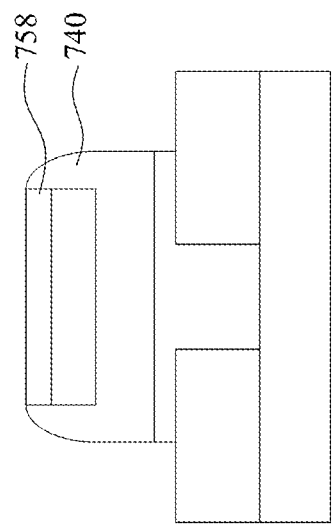
FIG. 7a, 7b, 7c, 7d, and 7e illustrate cross sectional views of intermediate stages in the formation of an FTJ capacitor, in accordance with some embodiments.
Figure 7B:
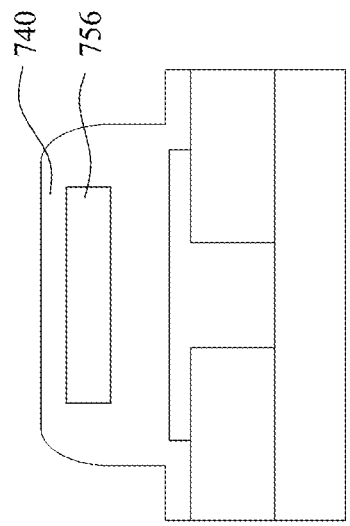
Figure 7A:
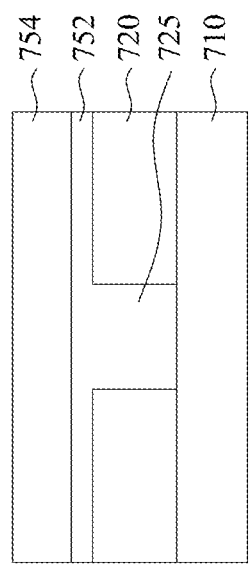

Referring now to FIGS. 7a-7e, an FTJ capacitor is disclosed. An interlayer surface 710 is depicted in FIG. 7a, which may be formed within or over the surface of another layer of a semiconductor device (not depicted). The interlayer surface 710 may be any insulative and/or dielectric material. In many embodiments, the interlayer surface 710 may be $SiO_2$. A first dielectric layer 720 is formed over the interlayer surface 710, and a first opening 725 is formed there within. In some embodiments, the first dielectric layer 720 may be formed based on a selective additive process, and thus the first opening 725 may be formed in conjunction with the formation of the first dielectric layer 720. In some embodiments, the first dielectric layer 720 may be uniformly formed, and a portion thereafter removed to form the first opening 725. Conductive electrode material is placed (e.g., by a plating process such as electro-plating, CVD, PVD, pouring, etc.) to fill the first opening and deposit further material along a surface of the device, forming a first electrode 752. A ferroelectric film 754 is formed (e.g., installed, deposited, or placed) over the first electrode 752.

Turning to FIG. 7b, a second electrode 756 is formed over the ferroelectric film. A spacer material 740 is formed over the second electrode 756. In some embodiments, a hard mask (not depicted) may be deposited over at least of portion of the junction between the second electrode 756 and the spacer material 740. In some embodiments, a temporary mandrel (not depicted) may be placed in an approximate location of a second electrode, which may thereafter be removed and replaced with the second electrode 756.

Turning now to FIG. 7c, the spacer material 740 is depicted as reduced, such that the remaining spacer material 740 is formed into a pair of sidewall spacers. A hard mask 758 is disposed over the upper surface of the second electrode 756. In some embodiments, the hard mask 758 may formed prior to formation and/or the removal of the spacer material 740, such as to avoid removal of the upper electrode by the subtractive process used to remove the spacer material 740.

Figure 7E:
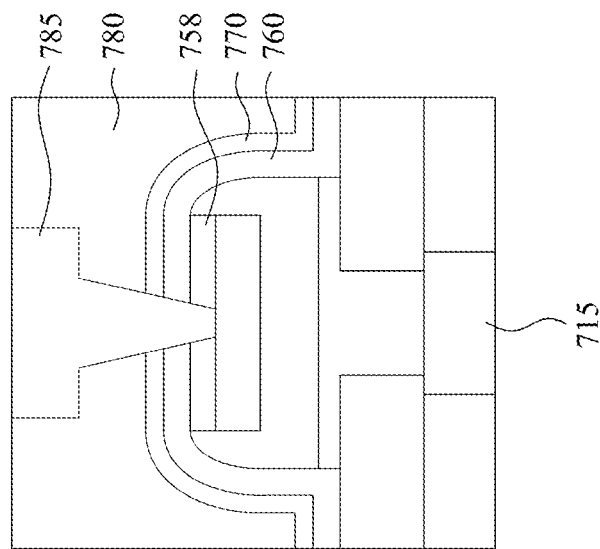
Figure 7D:
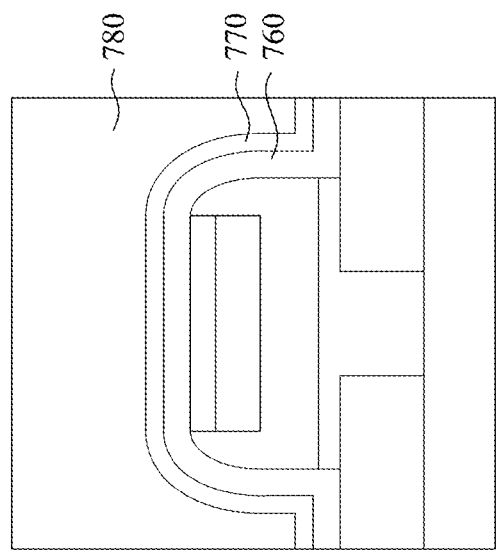

Referring to FIG. 7d, an etch stop film 760 and buffer film 770 are thereafter formed over the capacitor. A second dielectric is layer 780 (e.g., an ultra low-k dielectric) is formed over the buffer film 770 and/or the etch stop film 760. The etch stop film 760 and buffer film 770 may avoid undesirable interactions between portions of the device. For example, they may protect the capacitor from moisture absorbed and/or outgassed from an ultra-low-K dielectric of the second dielectric layer 780, protect the second dielectric layer from etches, resists, plasma discharge, electro-migration from capacitor voltages, etc. In some embodiments, either of the etch stop film 760 or buffer film 770 may be omitted (e.g., based on a selection of the dielectric of the second dielectric layer 780).

Referring to FIG. 7e, an interlayer surface opening 715 is illustrated, as is a second opening 785 through the second dielectric layer 780, the etch stop film 760, the buffer film 770, and the hard mask 758. The second opening 785 may be formed in one or more processes, and is thereafter filled (e.g., completely, partially, etc.) with a conductive material (e.g., comprising copper, or aluminum), such that one or more surfaces of the depicted layer may be electrically connected to various conductive elements.

Figure 8:
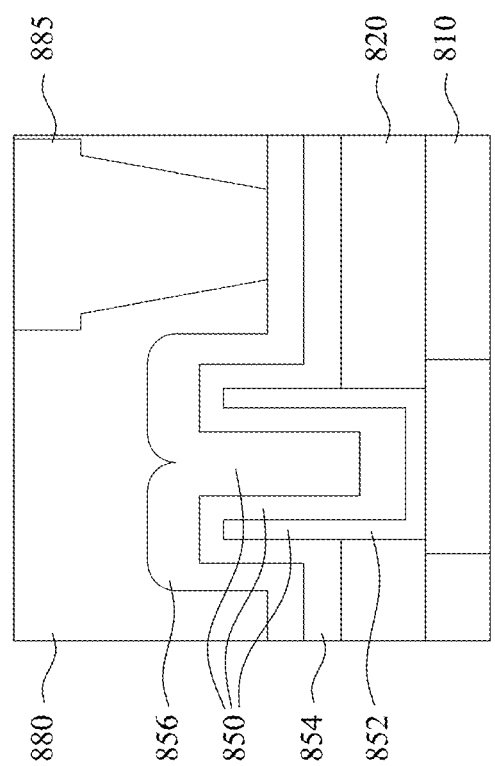
FIG. 8 illustrates a cross sectional view of yet another FTJ capacitor, in accordance with some embodiments.

Referring now to FIG. 8, yet another device is disclosed, comprising an interlayer surface 810, a first dielectric layer 820, and an FTJ capacitor 850 comprising a bottom electrode 852 a ferroelectric film 854, and a top electrode 856. The FTJ capacitor 850 follows a serpentine pattern which may, advantageously, lead to greater surface area, and thus greater capacitance, tunneling current (and difference in tunneling current depending on the polarization state of the ferroelectric film 854). A second dielectric layer 880 covers the device, having therein a second opening 885 which, in conjunction with a first opening 815 of the interlayer surface 810, provides electrical connectivity through the depicted portion of the semiconductor device. As one skilled in the art will understand, various FTJ capacitors may be formed having various geometries, intermediate layers, connectivity, etc.

Figure 9:
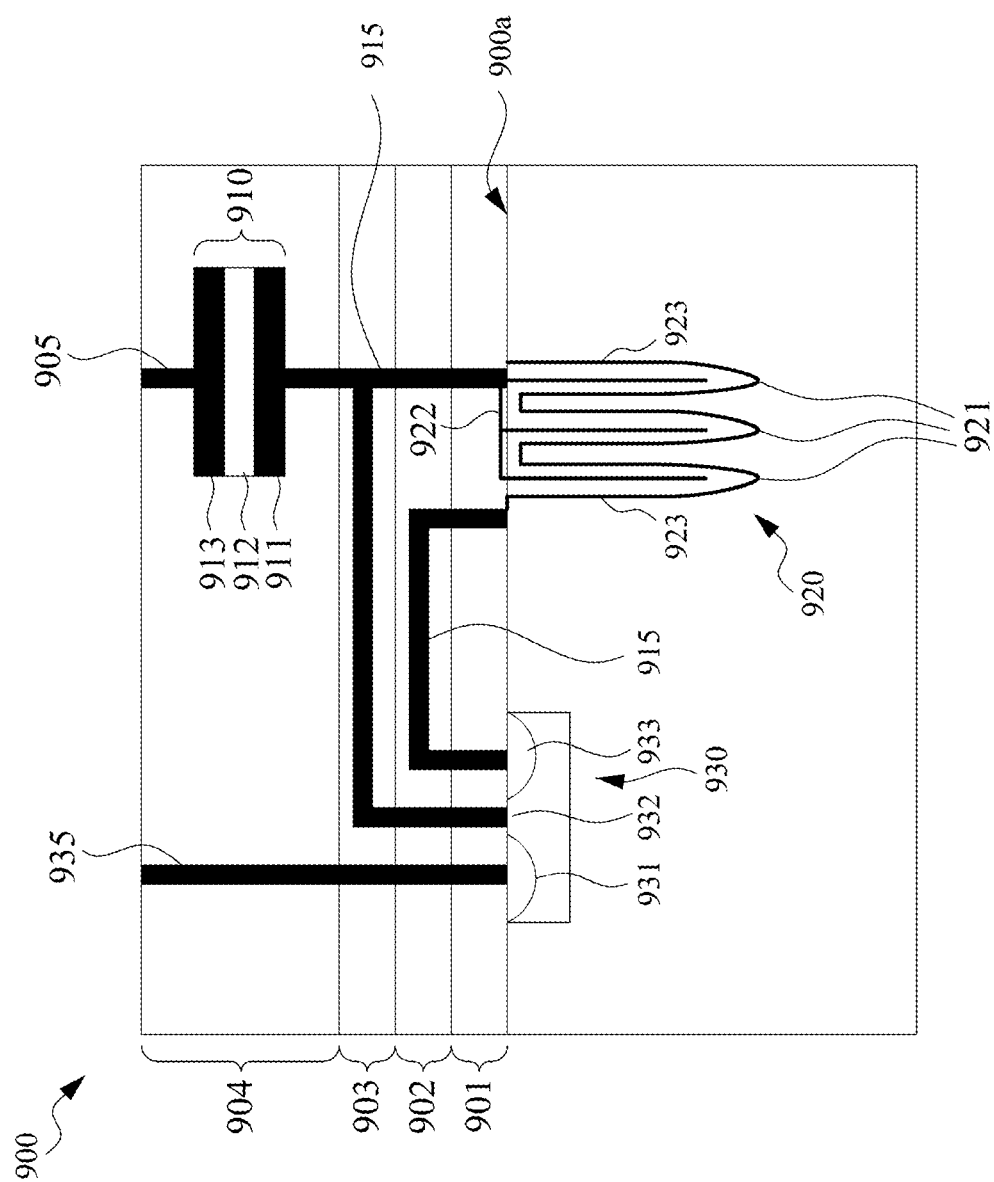
FIG. 9 illustrates a cross sectional view of a semiconductor device, in accordance with some embodiments.

Referring now to FIG. 9, a semiconductor device 900 is depicted. The semiconductor device 900 comprises a bit line 905 affixed to an upper electrode 913 of an FTJ capacitor 910. The FTJ capacitor 910 further comprises a ferroelectric film 912 and a lower electrode 911. In some embodiments, the FTJ capacitor 910 may comprise additional features or components. For example, some embodiments may incorporate any of the features referred to herein. The lower electrode is electrically connected to a second capacitor 920. The second capacitor 920 is a deep trench capacitor formed along the active surface 900a of a semiconductor chip. Some embodiments may use alternate or additional second capacitors 920. For example, a second capacitor 920 may be formed within the various metallization layers of the semiconductor, device 900, such as the same metallization layer as the FTJ capacitor 910, or a second capacitor may be a discrete capacitor connected thereto. The deep trench capacitor of FIG. 9 comprises a plurality of trenches 921 comprising a dielectric material (i.e., film), an upper electrode 922 shown connected to the FTJ capacitor 910, and a lower electrode 923 shown connected to a word line 915 and, in turn, to the drain (or source) of a first transistor 930.

The first transistor may be a field effect transistor, a bipolar transistor etc., and may be manufactured from silicon, germanium, a III-V semiconductor, a II-VI semiconductor, etc. In one embodiment, the first transistor is a silicon nMOSFET. The transistor may be formed by alternating doped regions (e.g., a first n-doped region 931, a channel 932, and a second n-doped region 933) along an active surface 900a of a semiconductor chip, which may be different than the semiconductor chip the second capacitor(s) are formed on. A source line 935 is connected to the source (or drain) of the transistor. In alternate embodiments, the transistor may be of any other type. For example, the transistor may be a planar, trench, FinFet, or nanowire capacitor. In some embodiments, the transistor type may be based on other transistors present in the device. (e.g., if an active surface 900a of a semiconductor chip is intended to comprise FinFet based digital logic circuits, the first transistor may be a FinFet). Advantageously, this homologation of transistors may remove process steps, or a number of chip to chip interconnects (e.g., by avoiding the use of a second or additional semiconductor chip).

In some embodiments, a single memory cell may be connected to digital circuitry. In some embodiments, a plurality of memory cells may be connected (e.g., through the metallization layers 901, 902, 903, 904) in an array and connected to a further circuitry to resolve currents to logical values. For example, a plurality of memory cells may be connected to form the array depicted in FIGS. 4a-4b.

Figure 10:
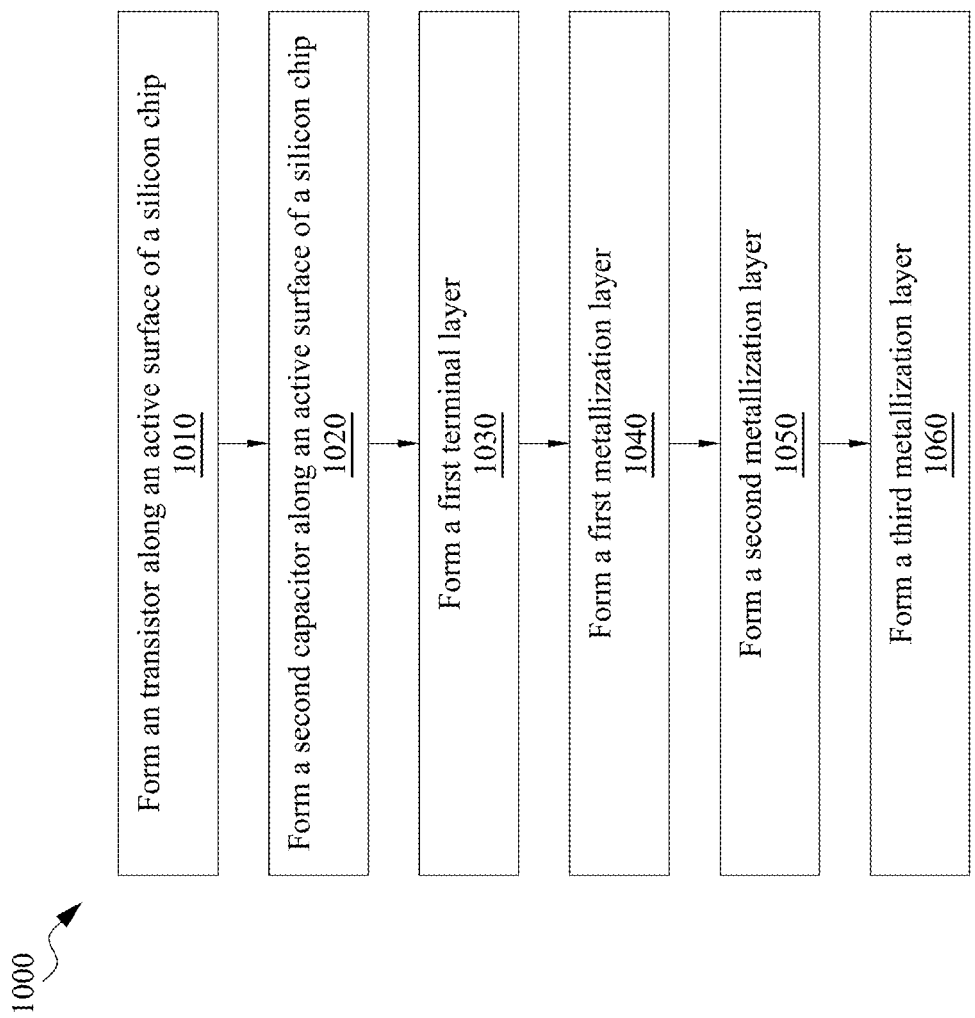
FIG. 10 includes a flowchart of an example method of fabricating an FTJ capacitor, in accordance with some embodiments.

FIG. 10 includes a flowchart of an example method 1000 of fabricating an FTJ capacitor, in accordance with some embodiments. The method 1000 may be used to fabricate a semiconductor device comprising an MIM capacitor, a FTJ capacitor, and a transistor. For example, at least some of the operations described in the method 1000 may result in the semiconductor device depicted in FIG. 9. The disclosed method 1000 is a non-limiting example; additional operations may be provided before, during, and after the method 1000 of FIG. 10. Some operations may only be described briefly herein, however, one skilled in the art will understand that the disclosed operations may be performed in conjunction with other disclosed methods disclosed herein, or generally known in the art. For example, one skilled in the art will understand that the various access lines disclosed herein may be joined to additional portions of the memory device, to sensing circuitry suitable to sense memory states of the FTJ and translate the memory cells to transistor-to-transistor logic levels, or to connect the access lines to bond wires, balls, bumps, etc.

The method 1000 comprises operation 1010, wherein a transistor is formed along an active surface of a semiconductor chip. At operation 1020, a second capacitor is formed along an active surface of the semiconductor chip. At operation 1030, a first terminal layer is formed over the semiconductor chip. At operation 1040, a first metallization level is formed, a second metallization level is formed at operation 1050, and a third metallization layer is formed at operation 1060.

At operation 1010, a transistor is formed along an active surface of a semiconductor chip. The transistor may be formed by doping a semiconductor (e.g., silicon) through a photolithographic controlled process, such as selective ion implantation, or diffusion. Various transistors are broadly compatible for use with the present disclosure, and may be formed. For example, a bipolar junction transistor may be used, such as in a device otherwise including bipolar junction transistors, which may reduce manufacturing complexity relative to forming a transistor of another type. Many embodiments will use field effect transistors (e.g., nMOS-FETs) which may, advantageously, improve density, and be formed with similar steps as other logic which, in many embodiments, are also present on the semiconductor chip.

At operation 1020, a second capacitor is formed along an active surface (i.e., major surface) of the semiconductor chip or other substrate. In some embodiments, the active surface may be shared with the transistor formed at operation 1010. In some embodiments, the capacitor may be formed on another semiconductor device, such as an integrated passive device, or another semiconductor chip. In alternate embodiments, the second capacitor may be formed in a metallization layer (e.g., by similar methods as the FTJ, substituting the ferroelectric film with another dielectric material such as a high-k dielectric in a similar configuration, in a two-dimensional square spiral pattern, etc.).

At operation 1030, a plurality of terminals are formed along the active surface of the semiconductor device(s). The plurality of terminals are configured to connect the active surface to conductive elements such as vias, redistribution structures, etc. For example, the terminals may electrically connect the active surface of the semiconductor chip with an aluminum or copper containing vias. The plurality of terminals comprise a gate terminal, drain terminal, and source terminal of the transistor, and an anode terminal and cathode terminal of the capacitor. In some embodiments, the terminals may electrically connect a plurality of devices (e.g., may electrically connect the drain/source of the transistor to the second capacitor). In some embodiments, the first terminal layer may be referred to as a metallization layer (e.g., the first metallization layer, or the zeroth metallization layer).

At operation 1040, a first metallization layer is formed, comprising metal structures to connect various lines, and/or pass various lines through the first metallization layer to additional layers, connectors, etc. The first metallization layer may be formed immediately adjacent to the plurality of terminals, or intermediate layers (e.g., metallization layers) may be disposed between the plurality of terminals and the first metallization layer. Indeed, in many embodiments, many intermediate metallization layers may be disposed between the plurality of terminals and the first metallization layer. The first metallization layer may comprise a third access line (e.g., a word line) connecting the transistor to the second capacitor. The first metallization layer may also comprise metal structures transiting the first metallization layer. For example, metal structures connecting the second access line to a plurality of additional transistors, second capacitors, voltage inputs, and other elements which are not depicted by FIG. 9. Metal structures passing a gate node (i.e., $V_g$) and a first access line (e.g., a source line) through the first metallization layer are also present. In alternate embodiments, a second access line (e.g., a bit line) may also pass through and/or connect within the first metallization layer, instead of or in addition to the said lines. Indeed, one skilled in the art will understand that various lines may be connected at or pass through various metallization layers according to a desired capacitance, trace length, or other routing constraints.

At operation 1050, a second metallization layer comprising additional metal structures is formed over the first metallization layer. The second metallization layer may comprise various connections and/or metal structures passed through. For example, a first and third access line may pass through the second metallization structure, and a terminal of the second capacitor may be connected to the gate node (e.g., through the first metallization layer).

At operation 1060, a third metallization layer comprising still further metal structures is formed over the second metallization layer. The third metallization layer (like other layers) may comprise a plurality of sub-operations, or sub-layers. For example, forming the third metallization layer may comprise forming a lower electrode, a ferroelectric film, and an upper electrode to form a first capacitor. The nomenclature of the first capacitor is not intended to denote a sequence of operations, and may be formed before, during, or after the second capacitor. One skilled in the art will understand that various connections may be made at any level of the semiconductor or other device. For example, any of the FTJ capacitors described herein (e.g., by FIG. 5*a*-5*g*, 7*a*-7*e*, or 9) may be formed within the third metallization layer. Although various methods are disclosed for the formation of the FTJ capacitor, in many embodiments, these comprise forming a first metal structure and second metal structure (e.g., an upper and lower electrode), having a ferroelectric film disposed therebetween. As disclosed, the ferroelectric film may be substantially horizontal, or comprise alternating horizontal and vertical portions (as in the case of a serpentine FTJ capacitor). Analogously, an MIM capacitor may be formed according to any disclosure herein, by substituting the ferroelectric film for another dielectric. For example, an MIM capacitor may be formed in any metallization level of the device, rather than at a major surface of a semiconductor device. Advantageously, such embodiments may simplify the formation of active surface on the semiconducting chip, and simplify routing between the first and second capacitors.

In one aspect of the present disclosure, a semiconductor device is disclosed. The semiconductor device includes an array comprising plurality of memory cells, each of which comprises a transistor have a gate, drain, and source, a first capacitor having a ferroelectric film disposed between two terminals, and a second capacitor having a dielectric film disposed between two terminals.

In another aspect of the present disclosure, a semiconductor device is disclosed. The semiconductor device includes a first capacitor having a first metal structure, a second metal structure, and a ferroelectric film disposed between the first and second metal structures, a first capacitor having a third metal structure, a fourth metal structure, and a dielectric film disposed between the third and fourth metal structures, and a transistor having a gate, a source, and a drain wherein the second metal structure is in electrical contact with the gate, and the third metal structure.

In yet another aspect of the present disclosure, a method for fabricating semiconductor devices is disclosed. The method includes forming a transistor having a gate, drain, and source along a major surface of a substrate, and forming a plurality of metallization layers over the transistor. The formation of the plurality of metallization layers comprises forming a first metal structure and a second metal structure with e ferroelectric film disposed therebetween, wherein the second metal structure is in electrical contact with the gate, and forming a third metal structure and a fourth metal structure with a dielectric film interposed therebetween, wherein the third metal structure is also in electrical contact with the gate, and the fourth metal structure is electrical contact with at least one of the drain or the source of the transistor.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a plurality of memory cells formed as an array,
wherein each of the plurality of memory cells comprises:
a transistor having a gate, a first drain/source, and a second drain/source;
a first capacitor having a ferroelectric film interposed between a first terminal and a second terminal; and
a second capacitor having a dielectric film interposed between a third terminal and a fourth terminal,
wherein the first drain/source is connected to a corresponding one a plurality of first access lines of the memory array, the first terminal is connected to a corresponding one of a plurality of second access lines of the memory array, and the second drain/source and the fourth terminal are connected to a corresponding one a plurality of third access lines of the memory array.

2. The memory device of claim 1, wherein the gate is connected to the second terminal and third terminal.

3. The memory device of claim 1, wherein the first capacitor is characterized with a plurality of resistance states thereby causing a voltage level at the gate to vary accordingly, when reading a corresponding one of the memory cells.

4. The memory device of claim 1, wherein a ground voltage is applied to the first access line, a programming voltage is applied to the second access line, and the ground voltage is applied to the third access line, when writing a corresponding one of the memory cells.

5. The memory device of claim 4, wherein the first capacitor is programmed to be in a high resistance state, causing the memory cell to present a logic 0.

6. The memory device of claim 1, wherein a programming voltage is applied to the first access line, a ground voltage is applied to the second access line, and the programming voltage is also applied to the third access line, when writing a logic 1 to a corresponding one of the memory cells.

7. The memory device of claim 6, wherein the first capacitor is programmed to be in a low resistance state, causing the memory cell to present a logic 1.

8. The memory device of claim 1, wherein the ferroelectric film is formed as a substantially horizontal sheet.

9. The memory device of claim 1, wherein the ferroelectric film is formed as having a plurality of horizontal portions and a plurality of vertical portions alternately connected to one another.

10. The memory device of claim 1, wherein the ferroelectric film is formed as a having a plurality of horizontal portions and a plurality of curved portions, and wherein each of the curved portions is connected between adjacent ones of the horizontal portions.

11. A memory device, comprising:
a first capacitor comprising:
a first metal structure;
a second metal structure; and
a ferroelectric film interposed between the first and second metal structures;
a second capacitor comprising:
a third metal structure;
a fourth metal structure; and
a dielectric film interposed between the third and fourth metal structures; and
a transistor comprising:
a gate;
a first drain/source; and
a second drain/source;
wherein the second metal structure is in electrical contact with the gate of the transistor and the third metal structure of the second capacitor; and
wherein the first drain/source is connected to a corresponding one of a plurality of first access lines, the first metal structure is connected to a corresponding one of a plurality of second access lines, and the second drain/source and the fourth metal structure are connected to a corresponding one of a plurality of third access lines.

12. The memory device of claim 11, wherein the ferroelectric film is formed as a substantially horizontal sheet.

13. The memory device of claim 11, wherein the ferroelectric film is formed as having a plurality of horizontal portions and a plurality of vertical portions alternately connected to one another.

14. The memory device of claim 11, wherein the ferroelectric film is formed as a having a plurality of horizontal portions and a plurality of curved portions, and wherein each of the curved portions is connected between adjacent ones of the horizontal portions.

15. The memory device of claim 11, wherein the ferroelectric film includes a material selected from a group consisting of: a metal oxide, a metal oxynitride, a doped metal oxide, and combinations thereof.

16. The memory device of claim 11, wherein the first capacitor is characterized with a plurality of resistance states thereby causing a voltage level at the gate to vary accordingly, when reading the memory device.

17. The memory device of claim 1, wherein a capacitance of the second capacitor is at least 5 times greater than a capacitance of the first capacitor.

18. The memory device of claim 1, wherein the second capacitor comprises a high-k dielectric material to achieve increased capacitance relative to the first capacitor while maintaining similar physical dimensions.

19. The memory device of claim 11, wherein the dielectric film of the second capacitor comprises a high-k dielectric material, and wherein a capacitance of the second capacitor is selected based on an available supply voltage to achieve a desired coercive voltage across the ferroelectric film.

20. The memory device of claim 11, wherein the second capacitor is configured to minimize leakage current relative to the first capacitor to maximize charge accumulation at the gate during memory read operations.

* * * * *